United States Patent [19]
Hoenig

[11] Patent Number: 4,916,114
[45] Date of Patent: Apr. 10, 1990

[54] METHOD FOR PRODUCING A LAYER-LIKE COMPOSITION OF OXIDE-CERAMIC SUPERCONDUCTING MATERIAL

[75] Inventor: Eckhardt Hoenig, Erlangen, Fed. Rep. of Germany

[73] Assignee: Siemens Aktiengesellschaft, Berlin and Munich, Fed. Rep. of Germany

[21] Appl. No.: 227,365

[22] Filed: Aug. 2, 1988

[30] Foreign Application Priority Data

Aug. 5, 1987 [DE] Fed. Rep. of Germany ....... 3726016

[51] Int. Cl.$^4$ .......................... B05D 5/12; C23C 16/00
[52] U.S. Cl. ......................... 505/1; 505/729; 505/732; 505/742; 427/62; 427/255.2; 427/255.3; 427/255.7; 156/614
[58] Field of Search ........................ 427/42, 62, 63, 38, 427/255.1, 255.2, 255.3, 255.7; 505/1, 729, 732, 742; 156/643, 611, 612, 614

[56] References Cited

U.S. PATENT DOCUMENTS

4,316,785  2/1982  Suzuki et al. ......................... 427/63

FOREIGN PATENT DOCUMENTS

0168530  7/1986  Japan .

OTHER PUBLICATIONS de Lima et al, *App. Phys. Lett.*, vol. 51, No. 5, 3 Aug. 87, 369-370.
Escudero, *Jap. J. of Appl. Phys. Lett.*, vol. 26, No. 6, Jun. 87, L1019-1020.
Robinson, *Science*, 5 Jun. 1987, p. 1189.
Politis et al, *MRS Conference*, Apr. 23-24, 1987, pp. 141-144.
Phys. Rev. Lett., vol. 58, No. 5, Jun. 22, 1987, pp. 2684-2686.
Japanese Journal of Applied Physics, vol. 26: No. 2, 2/2/87, pp. L123-L124; No. 4, Apr. 1987, pp. L377-L379; No. 5, May 1987, L815-L817; No. 6, Jun. 1987, pp. L923-L925, and No. 7, Jul. 1987, pp. L1248-L1250.
Europhys. Lett., 3 (12), pp. 1301-1307 (1987).
Frankfurter Allgemeine Zeitun, No. 166, 7/22/87, Part: Natur und Wissenschaft, pp. 21 and 22.
J. Am. Chem. Soc. 1987, 109, pp. 2838-2849.
Izvestija Akademii Nauk SSSR, Ser. Fiz., vol. 39, No. 5, 5/57, pp. 1080-1083.
Can. J. Phys., vol. 63, 1985, pp. 881-885.
MRS Symp of High Temperature Superconductors, Anaheim, Calif., Apr. 1987, by R. H. Hammon et al.
Eaton Corp., Danvers, Mass.: "ROA-400 Rapid Thermal Processor".
Peak Systems, Inc., Freemont, Calif., "ALP 6000 Rapid Thermal Processing".
"Anistropy of the Superconducting Magnetic Field $H_{c2}$ of a Single Crystal of $TmBa_2Cu_3O_7$", by H. Noel et al.

*Primary Examiner*—Norman Morgenstern
*Assistant Examiner*—Margaret Bueker
*Attorney, Agent, or Firm*—Kenyon & Kenyon

[57] ABSTRACT

With the method a layer-like composition of an oxide-ceramic superconducting material with a high transition temperature and great current carrying capacity on the basis of a materials system containing metallic components and oxygen can be prepared. The method is to be improved in the direction that layers with great current-carrying capacity can be formed also on non-monocrystalline substrates. It is provided for this purpose that a multi-layer layer of the superconductive material is applied on a fine-crystalline substrate by first making successive layers of individual films with a respective film thickness under 10 nm, and then this multilayer structure is converted into the desired superconducting phase by means of supplying oxygen and at a temperature below 400° C. For developing each individual film, the metallic components of the system are applied to the substrate that may be available, by means of a physical deposition process and while oxygen is being supplied, at a temperature below 400° C., and by means of short thermal pulses a column structure is generated which comprises columns tightly packed with c-axes at least approximately perpendicular to the respective underlayer.

22 Claims, 3 Drawing Sheets

METHOD FOR PRODUCING A LAYER-LIKE COMPOSITION OF OXIDE-CERAMIC SUPERCONDUCTING MATERIAL

BACKGROUND OF THE INVENTION

The present invention relates to a method for producing a layer-like composition of oxide-ceramic superconductive material with a high transition temperature and large current-carrying capacity on the basis of a system of materials containing metallic components and oxygen with which method the metallic components of the system are applied in a physical deposition process while oxyqen is being supplied to a predetermined substrate as a preliminary product with a structure still disordered with respect of the metal oxide phase to be developed, which structure is converted into the desired superconducting metal oxide phase, using a heat treatment and while continuing the oxygen supply. Such a method is known, for instance, from "Physical Review Letters", Vol. 58, No. 25, June 22, 1987, pages 2684 to 2686.

Films or thin layers of superconducting metal oxide compounds such as on the basis of a material system Me1-Me2-Cu-0 (Me1=rare earths including yttrium; Me2=earth alkali metals) with high transition temperatures $T_c$ of, for instance, 40 K or about 90 K are often produced with special vapor deposition or sputtering processes. Here, a preliminary product of the components of the chosen material system with its structure is deposited which still has fault structures with respect to the super-conducting metal oxide phase on a suitable substrate This preliminary product is subsequently converted into material with a desired super-conducting phase generally by an annealing treatment which must generally be carried out while oxygen is being supplied.

The superconducting metal oxide phases which can be obtained in this manner and the structures of which may be similar to that of a perowskite, have, in the case of $(La-Me2)_2 CuO_{4-y}$ (with $y \geq 0$), a tetragonal $K_2NiF_4$ structure (see "Japanese Journal of Applied Physics", Vol. 26, No. 2, Part II-Letters, February 1987, pages L123 and L124). In contrast thereto, an orthorhombic structure is assumed in the case of $YBa_2Cu_3O_{7-x}$ (see, for instance, "Europhysics Letters", Vol. 3, No. 12, June 15, 1987, pages 1301 to 1307). Since these materials exhibiting these superconducting phases resemble an oxide ceramic, the corresponding high-$T_c$ superconductors are also called oxide-ceramic superconductors.

In addition, it is also known from the publication "Phys. Rev. Lett.", mentioned above to produce monocrystalline films of the system $YBa_2Cu_3O_{7-x}$ ($x \approx 0$) on a monocrystalline $SrTiO_3$ substrate. To this end, the three metallic components of the system are first vapor deposited from separate evaporation sources in an oxygen atmosphere to the substrate heated to about 400° C. The preliminary product so obtained however still has a (disordered) structure. By means of a subsequent treatment at a high temperature of about 900° C., while oxygen is being supplied, epitaxially grown single crystals of the desired super-conducting high-$T_c$ phase are then obtained. The films so prepared exhibit a high current-carrying capacity of more than $10^5 A/cm^2$ at 77 K.

The current densities of $10^5 A/cm^2$ achieved with the epitaxial Y-Ba-Cu-0 films at 77 K seem to make the use of these films as a wiring plane in integrated circuits with, for instance, HEM transistors (High Electron Mobility transistors) possible as active elements. The use of the substrate of $SrTiO_3$ described in the publication "Phys. Rev. Lett." requires, however, to start in the assembly of such an integrated hybrid circuit with the, of necessity, sole wiring plane of the super-conductive material mentioned. The circuit of a semiconducting material would then have to be built-up on this plane. Similar techniques are under control so far only for Si semiconductor circuits. In addition, they are connected with a loss of quality and can be carried out only at great expense of equipment and therefore, financial means.

SUMMARY OF THE INVENTION

It is therefore an object of the present invention to develop the method of the type mentioned above such that layers capable of carrying large currents can be produced in several layers on top of each other and on non-monocrystalline substrates.

The above and other objects of the invention are achieved by a method for manufacturing a layer-like composition of an oxide-ceramic superconductive material with a high transition temperature and great current-carrying capacity on the basis of a material system containing metallic componnnts and oxygen, in which method the metallic components of the system are applied in a physical deposition process and while oxygen is supplied on a predetermined substrate as a preliminary product with a structure which still is disordered with respect to the superconducting metal oxide phase to be formed, which structure is converted, using a heat treatment and while oxygen continues to be supplied, into the desired superconducting oxide phase, the method comprising the steps of applying a multilayer layer of the superconducting material on a fine-crystalline substrate by the step of forming first, successive layers of individual films with a respective film thickness under 10 nm, where the step of forming each of these films comprises applying the metallic components of the system to the respectively provided physical underlayer (substrate) by means of the physical deposition process and supplying oxygen at a temperature below 400° C. and converting the so obtained preliminary product by means of short thermal pulses into an intermediate product with a columnar structure which exhibits columns densely packed and c-axes standing at least approximately perpendicularly to the respective underlayer (substrate), and then forming the desired super-conducting metal oxide phase in the intermediate products of all films by means of further oxygen supply and at a temperature below 400° C.

A fine-crystalline material is understood here to mean any material stimulating the column growth of the intermediate product which consists of grains of a size of only a few elementary cells. In the case of compounds such as in particular $SrTiO_3$, the substrate material is only approximately amorphous upon X-ray spectroscopy examination; i.e., the size randomness does not extend down to the atomic size.

In the measures according to the invention, it is assumed that complete epitaxy on monocrystalline substrates as is required according to the publication "Phys. Rev. Lett." mentioned, is not necessary for developing conductor planes with a required current carrying capacity of at least $10^4 A/cm^2$ at temperatures near the critical temperature $T_c$ of the material. Rather, a column growth on suitable fine-crystalline material is sufficient which ensures an alignment of the c-mass of the crystalline of the superconducting phase with perowskite-like structure at least approximately perpendicular to the provided current conduction direction located in the film planes. In contrast thereto, the other crystal axes can be oriented in any desired manner (statistically distributed). Since the high-$T_c$ superconductor material is anisotropic and has a layer structure in the atomic fine structure, so that the high current density comes about only by conducting the current preferably in the layers of this fine structure, it is sufficient to prepare films of the superconducting material with fine structure layers which extend at least largely parallel to the substrate and therefore parallel to the predominant current conduction direction, i.e., with an orientation of the c-axis perpendicular to the substrate, the orientation of the and b axes is not particularly important. Thereby, the method according to the invention is simplified accordingly over the known epitaxy methods. In addition, also multilayer films can advantageously be produced which lie in different planes. Consequently, these layers can also be used if these layers are employed in hybrid circuits with semiconducting materials. This is ensured particularly by the relatively low temperature conditions during the deposition process and in the subsequent oxygen loading of the intermediate product for forming the desired high-$T_c$ phase. The required heat treatment of the films of the preliminary product of the films still containing fault (disordered) structures for forming the intermediate product is carried out in apparatus known per se for generating short thermal pulses. The thermal pulses of these devices can advantageously be provided in specific quantities such that the annealing of each individual, but still fault-structured film of the preliminary product can be carried out while also the semiconducting layer of the hybrid circuit lying underneath or side by side are also heated, practically none of the diffusion processes damaging the semiconducting layers come about in practice because of the short time of the thermal process.

BRIEF DESCRIPTION OF THE DRAWINGS

For a further explanation of the invention, reference is made to the drawings in which.

In the figures, corresponding parts are provided with the same reference symbols.

DETAILED DESCRIPTION

With the method according to the invention, multilayer films of thin quasi-stacked films of known superconducting high-$T_c$ materials on a fine-crystalline substrate can be manufactured. The material system Me1-Me2-Cu-0 has been selected as an embodiment. However, the method according to the invention is not limited to this material system; i.e., it is suited equally well also for other oxideceramic high-$T_c$ superconducting materials, containing metallic components which are not consideeed to be part of the mentioned material system. The individual films for which, according to the embodiment, a material with a composition Me1-Me2-Cu-0 is chosen should have here a film thickness of less than 10 nm and preferably less than 1 nm and should ensure a large current carrying capacity in the order of at least $10^4 A/cm^2$ in the vicinity of the transition temperature $T_c$ of the material. The film thicknesses are therefore in the order of the spacings of the Cu-0 lattice planes which are made responsible for the current transport in the crystals of the high-$T_c$ phases (see, for instance, "Frankfurter Allgemeine Zeitung" No. 166, July 22, 1987, Part: Natur und Wissenschaft, pages 21 and 22). As the starting material of the films are to be chosen for the selected embodiment Me1 and Me2 from the group of rare earth metals such as Y or La and, for instance Sr or Ba from the group of earth alkali metals. Materials suitable for Me1, are given, besides Y, for instance, in "Japanese Journal of Applied Physics", Vol. 26, No. 5, Part II-Letters, May 1987, pages 815 to 817. The corresponding metallic components of the system Me1-Me2-Cu-0 should contain at least one (chemical) element of the mentioned group or consist of this at least one element, i.e., Me1 and Me2 are preferably present in elemental form. Optionally, however, also alloys or compounds or other compositions of these metals with substitution materials are suitable as starting materials, i.e., at least one of the mentioned elements can partially be substituted by other elements (see, for instance, "Journal of the American Chemical Society", Vol 109, No. 9, 1987, pages 2848 and 2849). The materials to be chosen for the substrate are those which at least contain fine crystalline $Al_2O_3$, $ZrO_2$, MgO or $SrTiO_3$. Perowskite-oxidic materials are particularly well suited, the lattice constants of which have dimensions which are one-times or multiples (see "Japanese Journal of Applied Physics", Vol. 26, No. 7, Part II-Letters, July 1987, pages L1248 to L1250,) of the corresponding dimensions of the a- and/or b-axes of the columns of the superconductive material growing thereon.

For this reason, an $SrTiO_3$ substrate is particularly advantageous. Substrates with a suitable texture are generally known (see, for instance, "Izvestija Akademii Nauk SSSR", Ser. Fiz., Vol. 39, No. 5, May 1975, pages 1080 to 1083).

Figure 1:
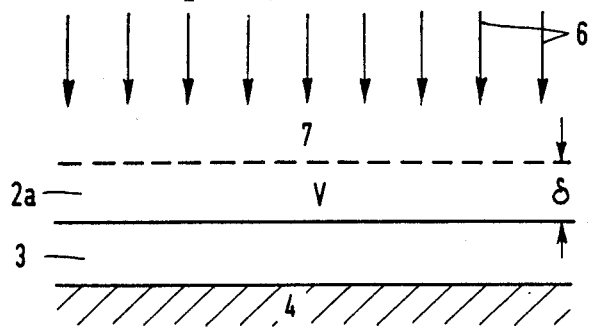
FIGS. 1 to 3 show individual steps for carrying out the method according to the invention.
Figure 2:
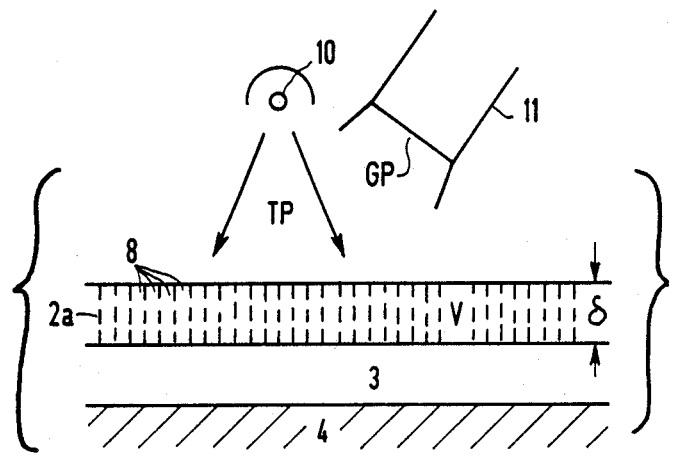
Figure 3:
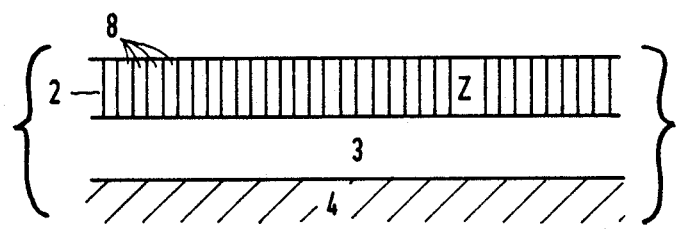

As a corresponding concrete embodiment, the preparation of a first film of a multilayer layer of a material with the known composition $YBa_2Cu_3O_{7-x}$ is taken as the basis according to the sections shown in FIGS. 1 to 3. This film is to be formed on a substrate 3. This substrate can be in particular an SrTiO or $(Ba,Sr)TiO_3$ layer 3 with a fine-crystalline texture deposited on a carrier body for instance, a vapor-deposited or sputter-on layer which has a texture with a predetermined pronounced orientation.

According to FIG. 1, a thin film 2a of the metallic components Y, Ba and Cu of the material system is allowed to grow reactively on a thin substrate 3 supported by a carrier 4 in a PVD (physical vapor deposition) process while oxygen is being supplied, up to a maximum film thickness δ of less than 10 nm and preferably less than 1 nm. This film 2a still has of less than with respect to the superconducting high-$T_c$ metal oxide phase, a fault-structured texture. For the preparation of this film 2a, one starts out with targets of the three high-purity metallic components of the system. As is to be indicated in FIG. 1, by lines 6 with arrows, the material of these three metallic targets is then deposited simultaneously, for instance, by means of an RF-aided laser evaporation system in an oxygen atmosphere 7 on the substrate 3. The substrate can be held here advantageously at relatively low temperatures. Suitable temperatures are between 400° C. and room temperature. Such deposition systems are generally known. The individual process parameters for the deposition process such as in particular, pressure and deposition rate, are set here so that the film 2a gradually grows on the substrate 3 up to the mentioned film thickness δ. Due to the special choice for the substrate 3, its texture is transferred at least in part to the growing crystals. At the end of the deposition process one then has a preliminary product V of the superconductive material to be manufactured which, however, still is fault-structured with respect to the high-$T_c$ phase.

Deviating from the mentioned reactive RF-aided laser evaporator for the deposition of the preliminary product, also other PVD processes such as vapor deposition by means of three separate electron beam sources with oxygen being supplied is possible (see, for instance, preprint of the contribution by R. H. Hammond et al, with the title "Superconducting Thin Films on perowskite Superconductors by Electron Beam Deposition" to MRS Symposium on High Temperature Superconductors, Anaheim, Calif., pages 23 and 24, Apr. 23/24, 1987.

According to FIG. 2, the preliminary product is converted into an intermediate product which generally is still fault-structured with respect to the desired $T_c$ phase and does yet not make the required high current density possible. According to the invention, this intermediate product takes place by the provision that a short thermal pulse is made to act on the preliminary product while oxygen is still supplied at the same time or as a low-energy ion stream. Suitable methods and systems are generally known from semiconductor technology (see, for instance, "Canadian Journal of Physics", Vol. 63, 1985, pages 881 to 885; Eaton Corporation, Danvers, Mass.: ROA-400 Rapid Thermal Processor", as well as the correspoding publication "A Short Course in Rapid Thermal Processig";Peak Systems, Inc. Freemont, Calif., "ALP 6000 Rapid Thrmal Processing"). Accordingly, a thermal pulse from a commerial Xe lamp 10 generated by a so-called flash-anneal pulse TP is shot on the thin film a of the preliminary product V. The intensity and the duration of the pulse are matched there so that the crystals in the individual atom layers, i.e., the film 2a, are aligned to form columns 8 on the texturized substrate. The formation of such column structures, using fine-crystalline carriers and through the choice of suitable growth conditions, for instance, in the manufacture of CoCr storage layers according to the principle of vertical magnetization is known (see, for instance, "Japanese Journal of Applied Physics, Vol. 26, No. 6, Part II-Letters, June 1987, pages L1923 to L1925.) The column alignment parallel to the normal, according to the invention, must be made on the substrat 3 within a few degrees. Also, the columns 8 must not be singled out in order to create grain boundaries that can carry large currents. For forming such column structures, pulse durations in the range of seconds are in general sufficient. As is further indicated in FIG. 2, an oxygen atmosphere required for the column growth during the thermal pulse TP can be generated advantageously by the provision that a well dosed directional oxygen-gas pulse GP or an ion pulse from a source of low-energy oxygen ions is shot at the film 2a (with energies $E \leqq 100$ eV). Thereby, an incorporation of oxygen into the crystals of the column structure is advantageously aided. In the figure, only the exit of the gas pulse GP from a correspondingly aligned gas tube 11 is illustrated.

In the embodiment which forms the basis of FIGS. 1 and 2, it was assumed that first, the atomic layers of the film 2a of the preliminary product V are deposited, onto which subsequently the short thermal pulses TP act. Optionally, it is also possible however, that the thermal pulses are generated already during the deposition process, i.e., that both processes are carried out simultaneously. The arrangement of the flash bulb 10 must be chosen, however, so that it is not coated itself in the deposition process.

At the end of the deposition and heat treatment processes, then, according to FIG. 3, a first thin film 2 with the densely packed columns 8 exists. This film represents an intermediate product Z which is generally still fault-structured with respect to the desired superconducting high-$T_c$ phase of the material to be manufactured.

After a first film 2 has been made in this manner on the substrate 3 from the intermediate product Z, still further layers or such films are built up now in a suitable manner, according to the invention. There, the respective underlying film takes over the substrate function. Thus, a multilayer structure is obtained which now needs to be converted into the desired uperconducting material with the high transition-temperatre and the required large current-carrying capacity. To this end a fine oxygen adjustment must be made, according to the invention, in the crystal lattice of the intermediate product Z by subjecting the entire structure to an oxygen treatment in an oxygen-gas atmosphere or preferably in an oxygen-plasma atmosphere. This treatment can be carried out advantageously at temperatures below 400° C. and preferably, close to room temperature. At the end we then have a layer which is deposited on the predetermined substrate, has the desired uperconducting properties and is composed of several layers or thin superconducting films. The c-axes of the crystal structures of these films then lie at least approximately in the direction of the normal on the substrate surface.

Figure 4:
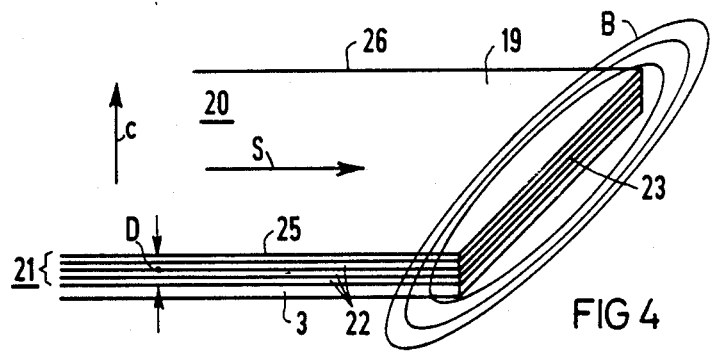
FIG. 4 shows a multilayered film built up according to the invention.

Discrete conductor runs can then be generated with a suitable multilayer structure, for instance, by known ion beam etching techniques. In FIG. 4, an end section 19 of a multilayer layer 21 forming such a conductor run 20 is indicated as an oblique view. According to the embodiment shown, this multilayer layer 21 arranged on a substrate 3 consists of four superconducting films 22 on top of each other, although the number of films can optionally be substantially larger. Further are illustrated in the figure the direction of the c-axis designated with c of the crystals structured according to the invention with the perowskite-like structure, the current conduction direction S as well as magnetic field lines B which are formed at the end face of the end section 19 of the conductor run 20. The long sides of this conductor run 20 are designated with 25 and 26.

As follows from the alignment of the c-axes of the crystals the current-carrying planes of these crystals are parallel to the film plane or the surface of the substrate; i.e., th other crystal axes can advantageously be aligned at random. The reason for this is that at the edges (longitudinal sides 25, 26) of the films 22, the flux in the form of the so-called fiuxoids, the multilayer layer attempts to penetrate parallel to the film planes (see, for instance, preprint by H. Noel, et al: "Anisotropy of the Superconducting Magnetic Field $H_{c2}$ of a Single Crystal of $TmBa_2Cu_3O_7$") but the edges act as flux barriers due to the field conditions formed at them. It is a condition for this that field components parallel to the film surface remain inactive. This is ensured by the fact that the conductor run 20 has a width B which is at least one order of magnitude larger than the entire thickness or the multiple layer 21. This effect, which can be considered as quasi-demagnetization of the individual films due to their geometric design, thus prevents incorporation of the fluxoids in the critical (current conducting) direction. Such a conductor is distinguished by the fact that at its long sides 25, 26, the critical field strength $H_{cl}$ in the direction of the c-axes is substantially greater than in the film plane parallel to the end face 23. With the invention one starts from the insight that not poor conduction perpendicular to the film planes, but drawing-in such fluxoids (with normal-conducting centers) between the films limits the current carrying capacity of the super-conducting material (see "Japanese Journal of Applied Physics", Vol. 26, No. 4, Part II-Letters, April 1987, pages L377 to L379). Thus, with conductor runs made in accordance with the invention, a larger critical current can be transported in the plane perpendicular to the c-axis than is true, for instance, in the case of a solid material with pronouncedly three-dimensional shape, so-called bulk material. For utilizing the mentioned effect, column growth according to the invention is therefore sufficient, while complete epitaxy such as given in the publication "Phys. Rev. Lett." mentioned above is not necessary.

Figure 5:
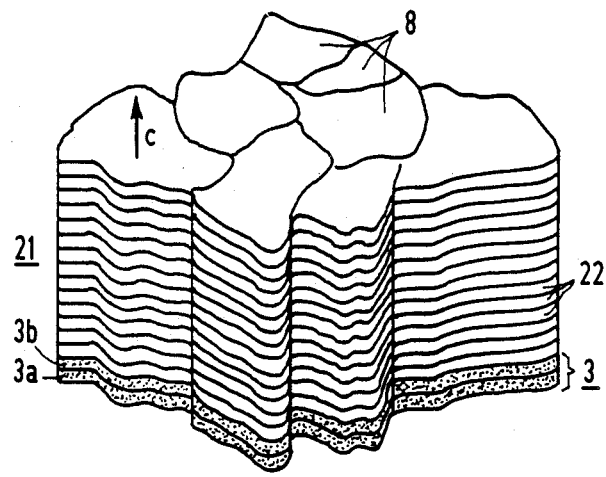
FIG. 5 shows a portion of FIG. 4 magnified.

In FIG. 5, a portion of the multilayer layer 21 shown in FIG. 4 is shown enlarged in a perspective view. As can be seen from this figure, the substrate 3, on which the multilayer layer is built according to the invention, can also consist of several thin layers 3a and 3b of the substrate material. This may involve, at least in the case of layer 3b, sputtered-on fine-crystalline $SrTiO_3$. In addition, the figure shows clearly the column growth of the individual films 22 that has taken place in the direction of the c-axis.

Figure 6:
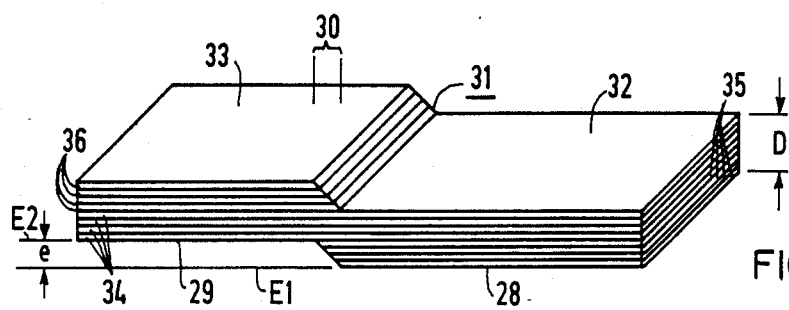
FIGS. 6 and 7 show connecting techniques for such layers.
Figure 7:
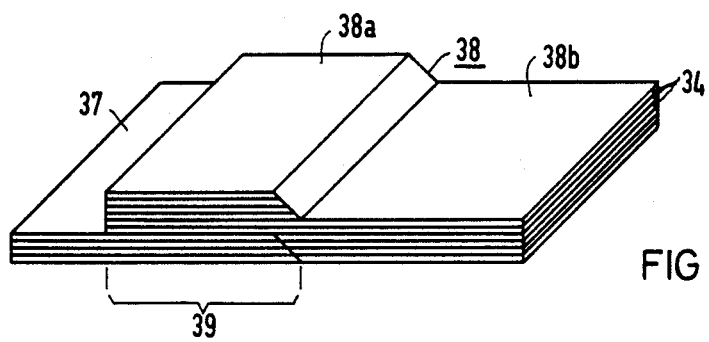

In FIGS. 6 and 7, two embodiments are schematically shown in a perspective view from which embodiment possibilities of layers or conductor runs produced in accordance with the invention with a transition between two planes can be seen.

FIG. 6 is based on a structure, not shown in detail, which is to be considered as the substrate and the surface of which is subdivided into two partial surfaces 28 and 29 which lie in different parallel planes E1 and E2. The mutual distance of the two planes E1 and E2 is designated with e. The partial surfaces 28 and 29 form between them a common step or a step-shaped region 30. A multilayer layer 31 is to lead over this region 30. This layer 31 is therefore subdivided by the step-shaped region 30 into two subsections 32 and 33 which lie in the planes E1 and E2. Between these subsections, a transition with the desired high current density is to be assured. For this purpose several layers of films are formed, according to the invention, successively on the two partial surfaces 28 and 29. The number of layers is chosen here so large that the respective total thickness D of the layer 31 or its subsections 32 and 33 is larger than the distance e of the plane E1 from the plane E2, since then advantageously several layers of plane films 34 result which are arranged quasi on the plane E2 and which extend beyond the step-like region 30 and are to be considered as part of subsection 32 as well as of subsection 33. The films 34 are therefore made quasi-continuous. In the vicinity of the subsection 32, these films 34 then lie on films 35 which fill the level difference between the planes E1 and E2. On the other hand, films 36 are further deposited on the films 34 in the vicinity of the subsection 3. With these design measures, a large-area transition with sufficient width can be created between the two subsections 32 and 33 beyond the step-like region 30.

Due to the possible design of a layer 31, shown in FIG. 6, with a transition from a plane E1 to a plane E2 parallel thereto at a step-shaped region 30, a large-area contact of two multilayer layers or conductor runs is possible which can be made according to the invention.

FIG. 7 shows a corresponding embodiment. To a first multilayer layer 37, a second multilayer layer 38 is to be added with an area so large that the required high current density can be assured. For this purpose, the layer 38 with a subsection 38a overlaps the layer 37 in a contact area 39 of sufficient size. The layer 38 is designed therefor corresponding to the layer 31 shown in FIG. 6, with a step which separates the overlapping subsection 38a of the layer 38 from its subsection 38b which lies in the plane of the layer 37.

Figure 8:
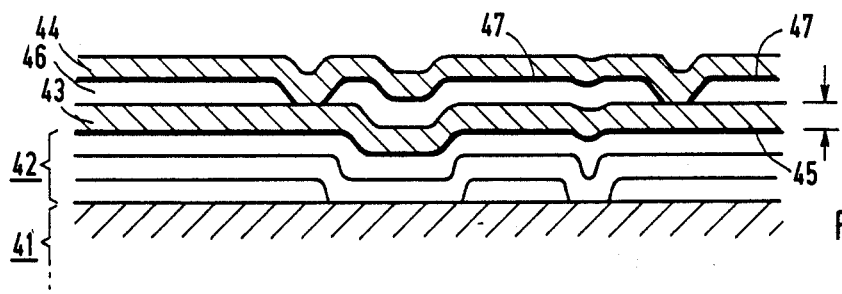
FIGS. 8 and 9 show applications of the layers prepared in accordance with the invention.

Due to the measures according to the invention, it is therefore possible to realize thin layers with multilayer construction of high-$T_c$ superconducting material with high current density in several planes (stories) of a hybrid circuit. Such an embodiment is shown schematically in FIG. 8 as a cross section. The hybrid circuit shown only in part in the figure contains a base body 41, for instance, of GaAs, on which any desired semiconductor circuit 42 with interspaced insulating layers is arranged. On this semiconductor circuit, two multilayer layers 43 and 44 serving as wiring planes according to this semiconductor circuit, of the high-$T_c$ superconducting material with a respective layer thickness d of a few tenths of a um are to be formed. To this end, the free surface of the semiconductor circuit 32 is coated as a quasi carrier with a thin film of a substrate material promoting column growth, for instance, of fine-crystalline $SrTiO_3$. This film is shown in the figure by a bold line designated with 45. According to the invention, the layer 43 of the first wiring plane is now applied successively to this substrate film 45. Since this wiring plane should make contact with the further wiring plane only in discrete places, a corresponding thin insulated intermediate layer 46, for instance, of a silicon oxide is deposited on the layer 43. This intermediate layer 46 must then still be coated with a film promoting column growth corresponding to film 45. Optionally, the intermediate layer 46 can consist also of the substrate material suitable therefor such as fine-crystalline $SrTiO_3$. On the structure so obtained, the multilayer layer 44 is formed according to the invention of high-$T_c$ superconducting material successively.

According to FIGS. 1 to 8, it was assumed that the substrate 3 on which a multilayer layer is to be made according to the invention is always designed at least approximately plane or in step fashion. However, the substrate can also have a curved shape. Thus, according to the perspective view of FIG. 9, a hollow cylindrical substrate 50 of, for instance, several cm diameter is provided. On this substrate, individual films 51 of the multilayer layer 52 are applied in accordance with the invention. The films 51 are to be made through column growth with a radially outward-pointing c-axis. It is an advantage of this arrangement that drawing fluxoids between the individual films is made more difficult in the chosen arrangement since drawn-in fluxoids must penetrate the individual films first. The current conduction direction of the arrangement, indicated by a line S with an arrow, is therefore again perpendicular to the c-axis and parallel to a central axis of the hollow-cylindrical substrate 50.

Figure 9:
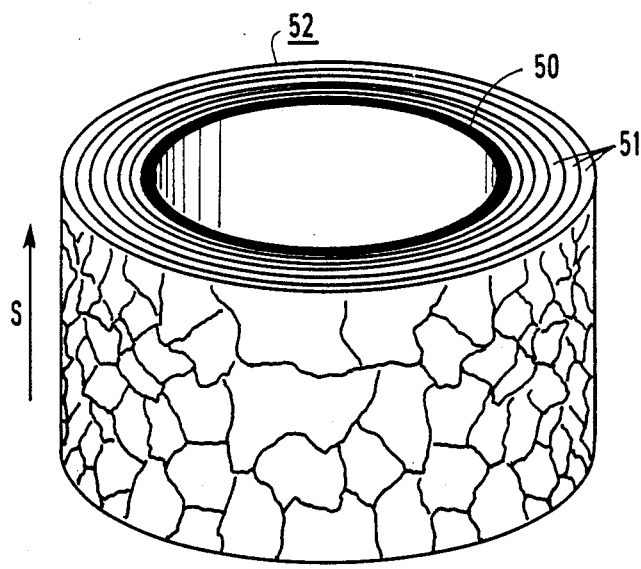

The structure shown in FIG. 9 can advantageously be cooled internally and is in particular suited as a conductor for transporting electric energy. In addition, the tube configuration shown is advantageous particularly for coaxial, self-shielding lines, in which the tubular multilayer layers arranged coaxially to each other, form, for instance, an outgoing and a return conductor.

As already mentioned, the method according to the invention is also suitable for material systems in which a partial substitution of at least one of the metallic components Me1, Me2, Cu is made. In general the content of the substitution element should be substantially smaller than that of the respective metallic components. Besides the substitution materials for Me1 and Me2 known from the mentioned publication "J.Am.Chem. Soc." Al is of interest as a further partial substitution element for Me1. Optionally, oxygen can be partially substituted by F. If substitution materials are provided, they can be vapor-deposited or sputtered on in the method according to the invention either jointly with the corresponding component from a source, or also from one source of its own.

In the foregoing specification, the invention has been described with reference to specific exemplary embodiments thereof. It will, however, be evident that various modifications and changes may be made there unto without departing from the broader spirit and scope of the invention as set forth in the appended claims. The specification and drawings are, accordingly, to be regarded in an illustrative rather than in a restrictive sense.

What is claimed is:

1. A method for manufacturing a layer-like composition of an oxide-ceramic superconductive material with a high transition temperature and large current-carrying capacity on the basis of a material system containing metallic components and oxygen, in which method the metallic components of the system are applied in a physical deposition process and while oxygen is supplied on a predetermined substrate as a preliminary product with a structure which still is disordered with respect to the superconducting metal oxide phase to be formed, which structure is converted, using a heat treatment and while oxygen continues to be supplied, into the desired superconducting oxide phase, the method comprising the steps of applying a multilayer layer of the superconducting material on a fine-crystalline substrate the steps of applying comprising first, forming successive layers of individual films with a respective film thickness under 10 nm, the step of forming each of these films comprising the steps of:

applying the metallic components of the system to the respectively provided underlayer by means of the physical deposition process and while supplying oxygen at a temperature below 400° C. and converting the so obtained preliminary product by means of short thermal pulses into an intermediate product with a columnar structure which exhibits columns densely packed and c-axes standing at least approximately perpendicularly to the respective underlayer, an then forming the desired superconducting metal oxide phase in the intermediate products of all films by means of further oxygen supply and at a temperature below 400° C.

2. The method recited in claim 1, wherein the oxygen treatment of the intermediate products is performed at a temperature near room temperature.

3. The method recited in claim 1, wherein the oxygen is provided as a gas stream and/or as an ion stream, for the oxygen treatment of the intermediate product.

4. The method recited in claim 1 wherein the multilayer layer of superconducting films is prepared with a respective thickness under 1 nm of said films.

5. The method recited in claim 1 wherein at least one thin layer on a carrier is provided as the substrate.

6. The method recited in claim 5, wherein a multilayer layer of the superconductive material is applied to a substrate film for which a semiconductor structure serves as the carrier.

7. The method recited in claim 1, wherein a substrate with tubular shape is provided.

8. The method recited in claim 1, wherein a material is chosen as the substrate material having a lattice constant which has dimensions which amount to about one or several times the corresponding dimensions of the a and/or b-axes of the crystals of the columns formed on it.

9. The method recited in claim 1, wherein a substrate is provided which contains at least $Al_2O_3$ or $ZrO_2$ or MgO or $SrTiO_3$.

10. The method recited in claim 1, wherein the preliminary product is subjected during the thermal pulse to a well-dosed directional oxygen-gas-pulse and/or to a low-energy oxygen-ion pulse.

11. The method recited in claim 1 wherein the thermal pulses are generated during the physical deposition process.

12. The method recited in claim 1, wherein an RF-aided laser evaporation of the separated metallic components of the system is provided while supplying oxygen as a gas and/or as an ion stream.

13. The method recited in claim 1, wherein the physical deposition process comprises evaporation of the separate metallic components by means of suitable electron beam sources and while oxygen is provided as a gas and/or as an ion stream.

14. The method recited in claim 1, wherein a multilayer layer with subsections extending over a step-like region of a substrate which subsections overlap over a large surface area and extends on both sides of the step-like region is prepared, where layers of films are formed in the subsections lying in common planes extending beyond the step-like region.

15. The method recited in claim 1, wherein two multilayer layers are connected to each other in a contact zone by an overlap of the layers over a large surface.

16. The method recited in claim 1, wherein, from the multilayer layer, a conductor run is formed having a total thickness which is at least one order of magnitude smaller than the width measured perpendicularly to the current conduction direction.

17. The method recited in claim 16, wherein the conductor runs are structured by means of ion-beam etching.

18. The method recited in claim 1, wherein at least one of the metallic components of the material system is substituted partially by a further metal.

19. The method recited in claim 1, wherein, for the layered composition, the oxide-ceramic superconducting material on the basis of a material system Me1-Me2-

Cu-0 is provided where the metallic component Me1 comprises a rare earth metal (including yttrium) and the metallic component Me2 comprises an alkaline earth metal.

20. The method recited in claim 19, wherein the first metallic component Me1 is partially substituted by a rare earth metal (including yttrium) or is substituted partially by Al.

21. The method recited in claim 19, wherein the second metallic component Me2 is substituted partially by another metal in the group of the metals provided for this component.

22. The method recited in claim 19, wherein oxygen is partially substituted by F.

* * * * *